United States Patent [19]
Noguchi

[11] Patent Number: 5,889,484
[45] Date of Patent: Mar. 30, 1999

[54] DIGITAL-TO-ANALOG CONVERTER

[75] Inventor: Yasunori Noguchi, Kyoto, Japan

[73] Assignee: Rohm Co., Ltd., Kyoto, Japan

[21] Appl. No.: 831,312

[22] Filed: Apr. 1, 1997

[30]     Foreign Application Priority Data

Apr. 1, 1996  [JP]  Japan .................................. 8-078656

[51] Int. Cl.⁶ ................................................. H03M 1/66
[52] U.S. Cl. ............................................ 341/144; 341/76
[58] Field of Search ................................. 341/76, 77, 144

[56]          References Cited

U.S. PATENT DOCUMENTS 5,243,347  9/1993  Jackson et al. .......................... 341/144
  5,355,134  10/1994  Kasuga et al. .......................... 341/144
  5,394,146  2/1995  Arimoto .................................... 341/118

*Primary Examiner*—Marc S. Hoff
*Attorney, Agent, or Firm*—Nikaido, Mamelstein, Murray & Oram LLP

[57]              ABSTRACT

A D/A converter has a plurality of input terminals, a plurality of current switchers, an adder for adding together the output currents from the plurality of current switchers, and a current-to-voltage converter. The D/A converter receives, via its input terminals, digital sound signals modulated by the adaptive delta modulation method or the delta modulation method. Each of the current switchers outputs a predetermined current, and switches the direction of the current in accordance with the digital signal it receives via the input terminal. The output currents of all of the current switchers are first added together by the adder, and then converted into a voltage by the current-to-voltage converter.

7 Claims, 4 Drawing Sheets

DIGITAL-TO-ANALOG CONVERTER

BACKGROUND OF THE INVENTION

1. Field of the Invention

The present invention relates to a digital-to-analog converter, and more particularly to a digital-to-analog converter based on the adaptive delta modulation method or the delta modulation method.

2. Description of the Prior Art

Digital-to-analog (hereinafter abbreviated to "D/A") converters based on the delta modulation method and D/A converters based on the adaptive delta modulation (hereinafter abbreviated to "ADM") method are used, for example, in karaoke apparatus. In such applications, D/A converters are used to mix a plurality of audio signals into one.

Conventionally, D/A converters of this type have an input terminal for receiving a first audio signal, an input terminal for receiving a second audio signal, current converters for converting digital audio signals received via those input terminals individually into current signals bit by bit, and current-to-voltage converters for converting the obtained currents individually into voltages. The two signals are eventually added together by a voltage adder. In such D/A converters, both the current-to-voltage converter and the voltage adder include an operational amplifier, and the current-to-voltage converter includes a capacitor as well. In this way, according to the prior art, the D/A converters need to be provided with two current-to-voltage converters, and thus with two capacitors, and this has been preventing cost reduction of such D/A converters.

SUMMARY OF THE INVENTION

An object of the present invention is to provide a D/A converter based on the ADM method or the delta modulation method that can be produced inexpensively with a reduced number of operational amplifiers and capacitors.

The D/A converter of the present invention is provided with a plurality of input terminals for individually receiving digital signals modulated by a delta modulation method; a plurality of current switchers connected one to one to the input terminals for individually switching directions (phases) of output currents thereof in accordance with the digital signals supplied thereto; adding means for adding together the output currents of the plurality of current switchers; and a current-to-voltage converter for converting by integration the added currents into a voltage.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
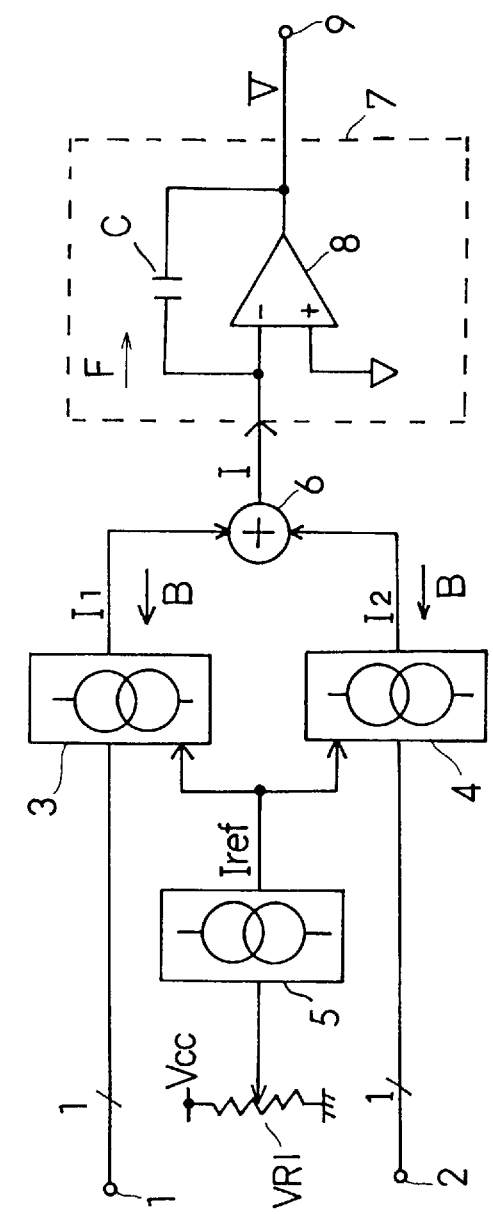
FIG. 1 is a block diagram of a D/A converter embodying the present invention.

Hereinafter, embodiments of the present invention will be described with reference to the drawings. FIG. 1 is a block diagram of a D/A converter embodying the present invention. This D/A converter receives via an input terminal 1 a first audio signal that is transmitted from a microphone bit by bit in the form of a digital signal, and receives via another input terminal 2 a second audio signal that is reproduced from a recording disk and transmitted therefrom bit by bit in the form of a digital signal. Here, the input signals are both digital signals modulated by the ADM method or the delta modulation method. For example, when the D/A converter is used in an echo generating apparatus, the two input signals are obtained as digital audio signals having different delays. The input terminals 1 and 2 are connected to current switchers 3 and 4, respectively.

When digital signals modulated by the delta modulation method are supplied to the input terminals 1 and 2, the current switchers 3 and 4 respectively pass predetermined currents $I_1$ and $I_2$ in the direction indicated by arrow B when the level of the supplied digital signal is high, and pass the predetermined currents $I_1$ and $I_2$ in the direction reverse to arrow B when the level of the supplied digital signal is low. The currents $I_1$ and $I_2$ are predetermined to be equal in magnitude to each other. By contrast, when digital signals modulated by the ADM method are supplied to the input terminals 1 and 2, the current switchers 3 and 4 not only switch the directions of the currents, but also control the magnitudes thereof in accordance with the step size.

Figure 2:
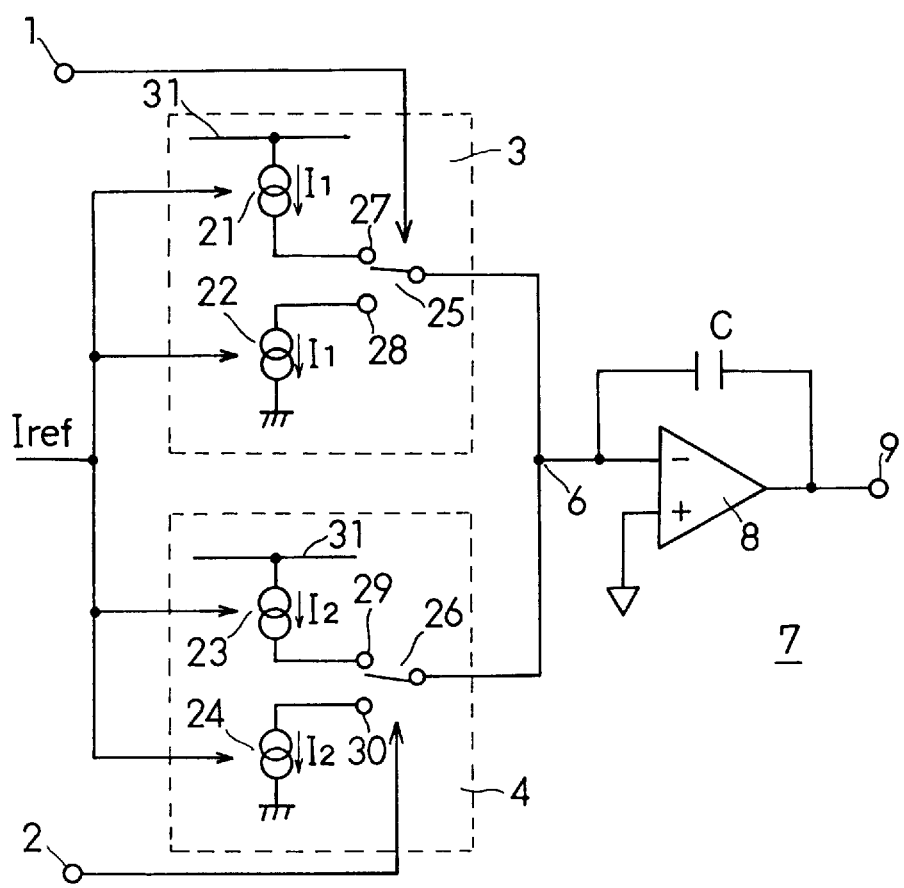
FIG. 2 is a circuit diagram showing the construction of the current switcher.

The current switchers 3 and 4 are connected to a reference current generator 5. The reference current generator 5 is connected to a variable resistor VR1 so that the reference current Iref output therefrom can be varied. The magnitudes of the currents $I_1$ and $I_2$ output from the current switchers 3 and 4 are controlled in accordance with the reference current Iref. As the reference current Iref increases, the currents $I_1$ and $I_2$ also increase; as the reference current Iref decreases, the currents $I_1$ and $I_2$ also decrease. A current adder 6 adds these currents $I_1$ and $I_2$ together, and outputs a composite current I. The current adder 6 is realized, for example, simply by connecting the lines of the currents $I_1$ and $I_2$, as shown in FIG. 2. In addition, an integrator 7 is provided that serves as a current-to-voltage converter.

The composite current I is then fed to an integrator 7. The integrator 7 converts the current I into a voltage V by integrating it. The integrator 7 consists of a capacitor C and an operational amplifier 8. When the current I flows in the direction indicated by arrow F, the output voltage V drops; when the current I flows in the direction reverse to arrow F, the output voltage V rises. That is, the output voltage V rises or drops in accordance with the charging current for the capacitor C. The voltage V, which is produced in this way from the digital signals received via the two input terminals 1 and 2, can be varied by controlling the reference current Iref. The voltage is outputted via an output terminal 9.

FIG. 2 is a circuit diagram showing the current switchers 3 and 4 in more detail. The current switchers 3 and 4 include constant current circuits 21 to 24. The constant current circuits 21 and 23 are connected, at their one end, to a power line 31, and are connected, at their other end, to the terminals 27 and 29 of switches 25 and 26, respectively. The constant current circuits 22 and 24 are connected, at their one end, to ground, and are connected, at their other end, to the terminals 28 and 30 of the switches 25 and 26, respectively. The directions in which the currents $I_1$ and $I_2$ flow through the constant current circuits 21 to 24 are indicated by the arrows in FIG. 2. The switches 25 and 26 are realized as semiconductor switching circuits. The switching operation of the switches 25 and 26 is controlled by the digital signals received via the input terminal 1 and 2. Since these digital signals are supplied bit by bit, as described earlier, the switches 25 and 26 may change their state bit by bit. For example, the switches 25 and 26 switch to the terminals 28 and 30 when they are fed with a high-level bit, and switch to the terminals 27 and 29 when they are fed with a low-level bit.

Figure 3:
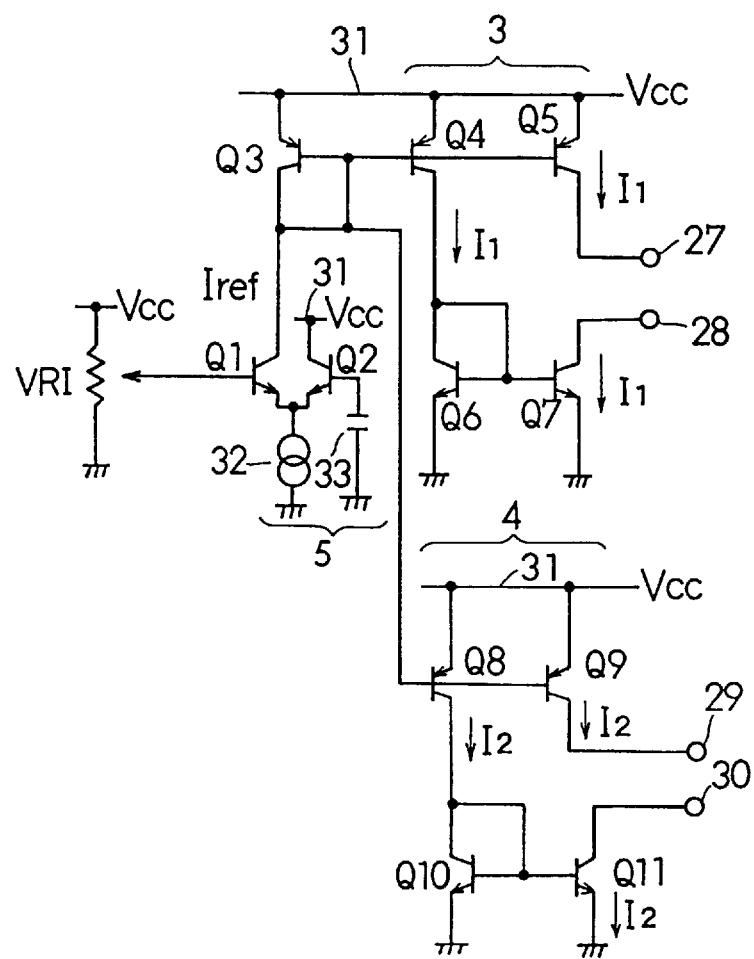
FIG. 3 is a circuit diagram showing in detail the construction of the current switcher and the reference current generator.

FIG. 3 is a circuit diagram of a specific example of the current switchers 3 and 4 and the reference current generator 5. The reference current generator 5 is constructed as a differential amplifier including a differential pair of npn-type transistors Q1 and Q2 and a constant current source 32. The base of the transistor Q1 is connected to the output terminal of the variable resistor VR1. The base of the transistor Q2 is connected to a constant voltage source 33. The collector of the transistor Q2 is connected to a power source line 31 having a voltage Vcc. The collector of the transistor Q1 is connected to the base and collector of a pnp-type transistor Q3. The emitter of the transistor Q3 is connected to the power source line 31. Together with the transistor Q3, pnp-type transistors Q4, Q5, Q8, and Q9 constitute a current mirror circuit, with the transistor Q3 constituting the input stage thereof and the transistors Q4, Q5, Q8 and 09 constituting the output stage thereof. The collector of the transistor Q5 is connected to the terminal 27 of the switch 25. The collector of the transistor Q4 is connected to the base and collector of an npn-type transistor Q6. Together with the transistor 06, an npn-type transistor Q7 constitutes a second current mirror circuit. The collector of the transistor Q7 is connected to the terminal 28 of the switch 25. The emitters of the transistors Q6 and Q7 are connected to ground. The collector of the transistor Q9 is connected to the terminal 29 of the switch 26. The collector of the transistor Q8 is connected to the base and collector of an npn-type transistor Q10. Together with the transistor Q10, an npn-type transistor Q11 constitutes a third current mirror circuit. The collector of the transistor Q11 is connected to the terminal 30 of the switch 26. The emitters of the transistors Q10 and Q11 are connected to ground. In FIG. 3, when the resistance of the variable resistor VR1 is varied, the current Iref flowing through the transistor Q1 varies, and thus the currents $I_1$ and $I_2$ vary accordingly.

As seen from FIG. 2, in the D/A converter of this embodiment, only one operational amplifier (indicated by numeral 8) is used. This helps produce the D/A converter inexpensively. Moreover, since the D/A converter of this embodiment requires only one capacitor, it can be produced inexpensively, and requires as few as two terminals for connecting a capacitor when integrated into an integrated circuit.

Although the D/A converter has only two input terminals 1 and 2 in this embodiment, it is possible to provide it with three or more input terminals. In that case, each input terminal is connected to a current switcher, and each current switcher is fed with the reference voltage Iref. The currents output from all of the current switchers are added together by the current adder 6, and the integrator 7 outputs a corresponding analog voltage V in accordance with the composite current I. In this way, it is possible to increase the number of input terminals easily.

Even when the number of input terminals is increased, the D/A converter of this embodiment requires only one integrator 7, and accordingly it does not require any additional operational amplifiers or terminals for capacitors.

Moreover, even if digital signals supplied to the current switchers 3 and 4 are modulated by the ADM method or the delta modulation method with different sampling periods from each other, the signals can be processed without any problem, since the currents $I_1$ and $I_2$ resulting from those signals are added together before being converted into a voltage by the integrator 7. This means that digital signals having different sampling frequencies, or even asynchronous digital signals can be processed. Furthermore, even if a signal modulated by the ADM method is supplied to one of the input terminals 1 and 2 and a signal modulated by the delta modulation method is supplied to the other, the signals can be added together and converted into an analog voltage, as long as the current switchers 3 and 4 can cope with the method by which the signal they receive is modulated.

Figure 4:
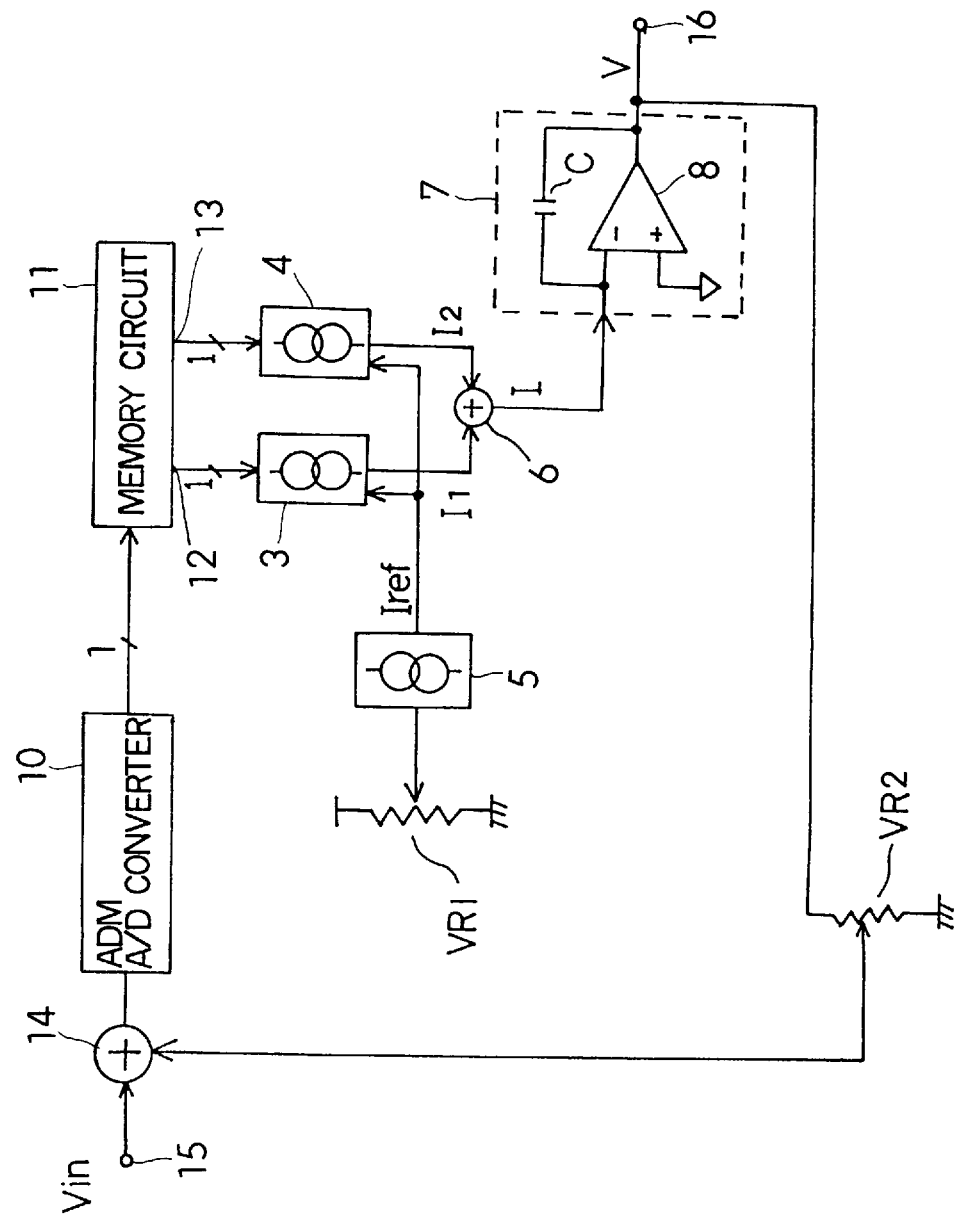
FIG. 4 is a block diagram of a sound reverberation circuit incorporating a D/A converter embodying the present invention.

FIG. 4 is a block diagram of a sound reverberation circuit employing the above D/A converter. Note that, in FIG. 4, such components as are found in FIG. 1 are identified with the same designations, and description of those components will not be repeated. This sound reverberation circuit adds an effect of reverberations resembling echoes to an audio signal it receives, and is used, for example, in a karaoke apparatus.

When an analog audio signal Vin is supplied to an input terminal 15, an analog-to-digital (hereinafter abbreviated to "A/D") converter 10 based on the ADM method converts it into a one-bit digital signal. The digital signal is then fed to a memory circuit 11. The memory circuit 11 serves as a delay circuit or delay line, that is, it separates the received digital signal into signals with different delays, and outputs them via terminals 12 and 13.

Note that the signals outputted via the terminals 12 and 13 are outputted not at the same time but with different delays. For example, the delay of the signal outputted via the terminal 12 is two thirds that of the signal outputted via the terminal 13. These signals are then fed to current switchers 3 and 4, respectively, and are used there to switch the directions of currents $I_1$ and $I_2$ in accordance with the ADM method.

Subsequently, the currents $I_1$ and $I_2$ are added together by a current adder 6, and fed, as a composite current I, to an integrator 7. The integrator 7 converts the current I into an analog voltage V, and outputs it via an output terminal 16. The output voltage V is fed through a variable resistor VR2 serving as a feedback resistor to a voltage adder 14, where it is added to the input signal Vin.

Thus, the output voltage V, after being attenuated by the variable resistor VR2, is superimposed on the input signal Vin by the voltage adder 14, and then the above described sequence of conversion operations is repeated. The level of reverberations is controlled by a variable resistor VR1. For example, when the variable resistor VR1 is operated in such a way as to increase a reference current Iref, the currents $I_1$ and $I_2$ output from the current switchers 3 and 4 increase, and consequently the voltage V resulting from the delayed signals increases, thereby enhancing the effect of reverberations.

On the other hand, the variable resistor VR2 controls how far the output voltage V is attenuated for feedback. When attenuation is low, a large portion of the voltage V is added to the input voltage Vin in the adder 14, and consequently the levels of the delayed signals from the memory circuit 11 increase. This causes a rise in the feedback voltage, and this in turn causes a further rise in the feedback voltage. As a result, longer reverberations are obtained. By contrast, when the variable resistor VR2 is operated in such a way as to heighten the attenuation of the voltage V, shorter reverberations are obtained.

Since, as described above, the sound reverberation circuit of this embodiment allows control of reverberations, it helps achieve various reverberation effects when it is incorporated into a karaoke apparatus or the like. Note that, even when three or more signals are output from the memory circuit 11, it is possible to convert those signals into an analog signal simply by making the D/A converter (FIG. 1) capable of handling an increased number of input signals, as noted earlier in the description of the D/A converter embodying the present invention.

A karaoke apparatus is often provided with, in addition to a sound reverberation circuit, a separate pitch shifting unit for controlling the pitch of reproduced sounds. The D/A converter according to the present invention can be employed in such a pitch shifting unit. The pitch shifting unit typically operates as follows. First, an analog signal is converted into a digital signal with a predetermined sampling period by an A/D converter based on the ADM method or the delta modulation method, and the obtained digital signal is stored in a ring buffer.

Next, the digital signal stored in the ring buffer is read out with a specific reading period, and is converted into an analog signal by a D/A converter. The shorter the reading period, the higher the pitch becomes; the longer the reading period, the lower the pitch becomes. In this way, the pitch of reproduced sounds is controlled. Since, in this type of pitch shifting unit, an input analog signal is first converted by an A/D converter into a digital signal, and the digital signal is then fed to a D/A converter, it is an effective way of realizing a sound controller to incorporate the D/A converter according to the present invention into such a pitch shifting unit and integrate the whole unit into an integrated circuit.

What is claimed is:

1. A digital-to-analog converter comprising:
    a plurality of input terminals for individually receiving digital signals modulated by a delta modulation method;
    a plurality of current switchers connected one to one to the input terminals for individually switching flow directions of output currents thereof in accordance with whether the digital signals received at the respective input terminals are at a high level or at a low level;
    adding means for adding together the output currents of the plurality of current switchers to produce a composite current; and
    a current-to-voltage converter for converting the composite current into a voltage by integration.

2. A digital-to-analog converter as claimed in claim 1,
    wherein at least one of the digital signals is a digital signal modulated by an adaptive delta modulation method, and the current switcher connected to a transmission line of that signal controls both a direction and a magnitude of its output current in accordance with the digital signal modulated by the adaptive delta modulation method.

3. A digital-to-analog converter as claimed in claim 1,
    wherein all of the current switchers are connected to one reference current generator so that magnitudes of currents outputted from the current switchers are controlled in accordance with a reference current generated by the reference current generator.

4. A sound controller having a digital-to-analog converter, wherein the digital-to-analog converter comprising:
    a plurality of input terminals for individually receiving digital signals modulated by a delta modulation method;
    a plurality of current switchers connected one to one to the input terminals for individually switching flow directions of output currents thereof in accordance with whether the digital signal received at the respective input terminals are at a high level or at a low level;
    adding means for adding together the output currents of the plurality of current switchers to produce a composite current; and
    a current-to-voltage converter for converting the composite current into a voltage by integration.

5. A sound controller as claimed in claim 4, further comprising:
    an analog-to-digital converter for converting an analog sound signal into a digital sound signal by an adaptive delta modulation method or by a delta modulation method;
    delay means for delaying the digital sound signal obtained from the analog-to-digital converter; and
    means for supplying the digital-to-analog converters with a plurality of digital sound signals that are output from the delay means with different delays.

6. A digital-to-analog converter comprising:
    a plurality of input terminals for individually receiving digital signals;
    a plurality of current switchers connected one to one to the input terminals, each of the current switchers including means for switching a flow direction of a current in accordance with whether the digital signal received at the corresponding input terminal is at a high level or at a low level;
    current producing means for supplying currents to the plurality of current switchers;
    adding means for adding together output currents of the plurality of current switchers to produce a composite current; and
    a current-to-voltage converter for converting the composite current into a voltage by integration.

7. A digital-to-analog converter as claimed in claim 6,
    wherein the current producing means has current varying means for varying values of the currents that it produces, and the current varying means for allowing the currents supplied to the plurality of current switchers to be varied simultaneously.

* * * * *